(12) United States Patent
Hush et al.

(10) Patent No.: US 8,924,803 B2
(45) Date of Patent: Dec. 30, 2014

(54) BOUNDARY SCAN TEST INTERFACE CIRCUIT

(71) Applicants: Glen Earl Hush, Boise, ID (US); Jeffrey P Wright, Boise, ID (US)

(72) Inventors: Glen Earl Hush, Boise, ID (US); Jeffrey P Wright, Boise, ID (US)

(73) Assignee: Nanya Technology Corporation, Taoyuan (TW)

( * ) Notice: Subject to any disclaimer, the term of this patent is extended or adjusted under 35 U.S.C. 154(b) by 167 days.

(21) Appl. No.: 13/653,422

(22) Filed: Oct. 17, 2012

(65) Prior Publication Data

US 2014/0108877 A1 Apr. 17, 2014

(51) Int. Cl.
*G01R 13/28* (2006.01)

(52) U.S. Cl.
USPC .......................................................... 714/727

(58) Field of Classification Search
USPC .................................................. 714/726, 727
See application file for complete search history.

(56) References Cited

U.S. PATENT DOCUMENTS

| | | | |
|---|---|---|---|
| 6,138,177 A * | 10/2000 | Williams et al. | 710/8 |
| 2005/0172191 A1* | 8/2005 | Liang | 714/726 |
| 2006/0156098 A1* | 7/2006 | Bawany et al. | 714/724 |
| 2011/0161757 A1* | 6/2011 | Haroun et al. | 714/727 |
| 2012/0331361 A1* | 12/2012 | Wang | 714/729 |

* cited by examiner

*Primary Examiner* — Sam Rizk
(74) *Attorney, Agent, or Firm* — Jianq Chyun IP Office

(57) ABSTRACT

The invention provides a boundary scan test interface circuit. The boundary scan test interface circuit includes N test input pads, a test interfacing module and M test output pads, wherein N and M are positive integers, and M is smaller than N. The test interfacing module is coupled to the test input pads. The test interfacing module having a plurality of logical gates, and each of input pins of each of the logical gates coupled to each of the test input pads. The test output pads are coupled to output pins of the logical gates in the test interfacing module.

7 Claims, 5 Drawing Sheets

BOUNDARY SCAN TEST INTERFACE CIRCUIT

BACKGROUND OF THE INVENTION

1. Field of Invention

The present invention generally relates to a boundary scan test interface circuit, and more particularly to the boundary scan test interface circuit for reducing the number of horizontal routes between a dynamic random access (DRAM) and a printed circuit board (PCB).

2. Description of Prior Art

Along with the rapid development of science and technology at the present, semiconductor memories are necessary devices for an electrical apparatus. For providing a larger storage size, a semiconductor memory has many address pins and control pins for addressing a plurality of memory cells in the semiconductor memory by a user. Accordingly, when a boundary scan test is processed on the semiconductor memory (such as a dynamic random access memory, (DRAM)), there are many horizontal routes connected to the address pins and control pins are needed. That is, a circuit size for the electrical apparatus having the DRAM is increased, and the prime cost of the electrical apparatus is increased correspondingly.

SUMMARY OF THE INVENTION

The present invention provides a boundary scan test interface circuit for reducing long horizontal routes in a chip.

The present invention provides the boundary scan test interface circuit. The boundary scan test interface circuit includes N test input pads, a test interfacing module and M test output pads, wherein N and M are positive integers, and M is smaller than N. The test interfacing module is coupled to the test input pads. The test interfacing module having a plurality of logical gates, and each of input pins of each of the logical gates coupled to each of the test input pads. The test output pads are coupled to output pins of the logical gates in the test interfacing module.

In an embodiment, each of the test input pads is coupled to one of the address pins and control pins of the DRAM, each of the test output pads is coupled to at least one data output pin of the DRAM.

In an embodiment, the logical gates include a plurality of XOR gates. Each of the XOR gates has at least two input pins, each of the input pins of the XOR gates is coupled to each of the test input pads, and each of output pins of the XOR gates is coupled to each of the test output pads.

In an embodiment, the logical gates include a plurality of XNOR gates, each of the XNOR gates has at least two input pins, each of the input pins of the XNOR gates is coupled to each of the test input pads, and each of output pins of the XNOR gates is coupled to each of the test output pads.

In an embodiment, the logical gates include a plurality of XOR gates and a plurality of inverters. Each of the XOR gates has at least two input pins, each of the input pins of the XOR gates is coupled to each of a first portion of the test input pads, and each of output pins of the first portion of the XOR gates is coupled to each of a first portion of the test output pads. Each of the input pins of the inverters is coupled to each of a second portion of the test input pads, and the output pins of each of the second portion of the inverters are coupled to a second portion of the test output pads.

In an embodiment, the logical gates include a plurality of XNOR gates and a plurality of inverters. Each of the XNOR gates has at least two input pins, each of the input pins of the XNOR gates is coupled to each of the test input pads, and each of the output pins of each of the XNOR gates is coupled to each of a first portion of the test output pads. Each of the input pins of the inverters is coupled to each of the output pins of the XNOR gates, and each of output pins of the inverters is coupled to each of a second portion of the test output pads.

In an embodiment, the boundary scan test interface circuit further includes a function block module, a selector, and a mode selecting circuit. The function block module has a plurality of function output pins and a plurality of function input pins. The selector is coupled between the function input pins, the test input pads and the input pins of the logical gates of the test interfacing module. The selector selects each of the function input pins or each of the input pins of the logical gates to connect to each of the test input pads according to a mode selecting signal. The mode selecting circuit is coupled to the selector, and the mode selecting circuit providing the mode selecting signal to the selector.

In an embodiment, the test interfacing module further comprises at least one conducting wire. The conducting wire is coupled between one of the test input pads and one of the test output pads.

Accordingly, the boundary scan test interface circuit is used to reduce the number of horizontal routes and still accomplish the boundary scan test function of being able to test opens/shorts on each of input and output pads. Accordingly, the die size can be reduced by using the boundary scan test interface circuit, and the prim cost is reduced correspondingly.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
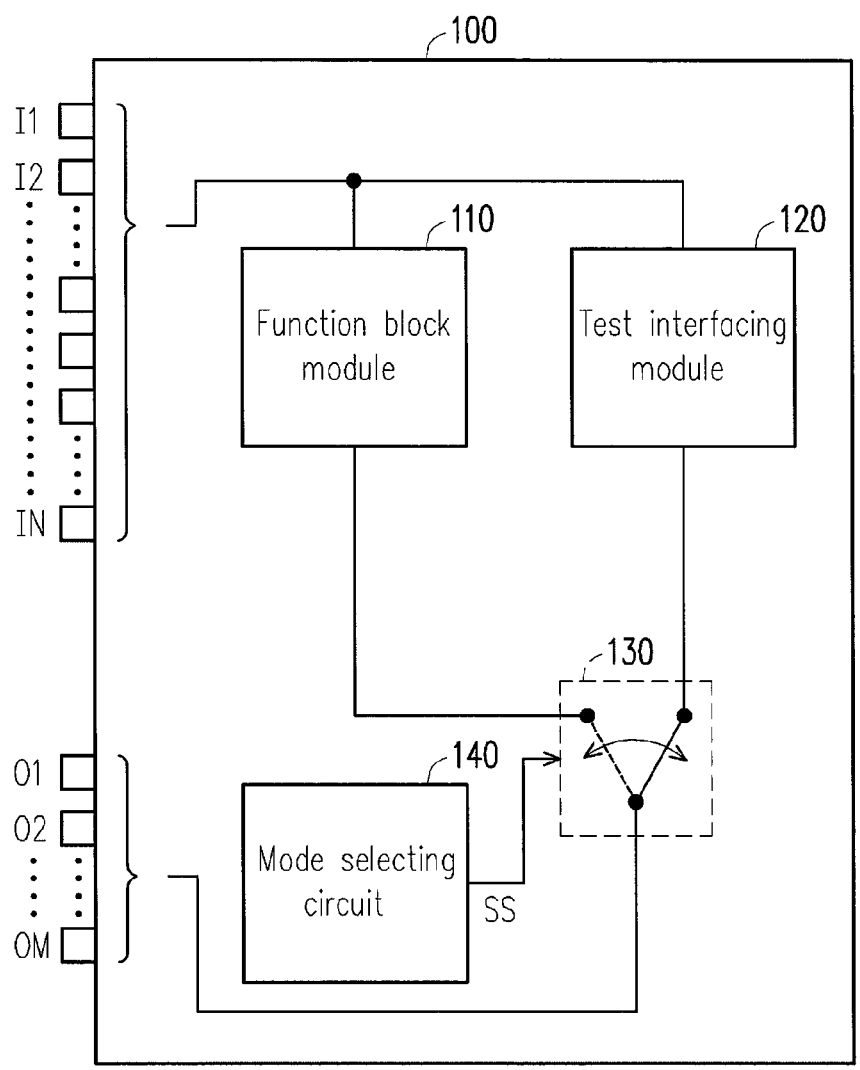
FIG. 1 is a block diagram of a boundary scan test interface circuit 100 according to an embodiment of the present invention.

Reference will now be made in detail to the present preferred embodiment of the invention, examples of which are illustrated in the accompanying drawings. Wherever possible, the same reference numbers are used in the drawings and the description to refer to the same or like parts.

Referring to FIG. 1, FIG. 1 is a block diagram of a boundary scan test interface circuit 100 according to an embodiment of the present invention. The boundary scan test interface circuit 100 includes test input pads I1-IN, test output pads O1-OM, a function block module 110, a test interfacing module 120, a selector 130 and a mode selecting circuit 140. The boundary scan test interface circuit 100 can be applied for a dynamic random access memory (DRAM). The test interfacing module 120 is coupled to the test input pads I1-IN and the selector 130. The test interfacing module 120 having a plurality of logical gates, and each of input pins of each of the logical gates coupled to each of the test input pads I1-IN. In this embodiment, the test input pads I1-IN are used to couple to address pins and control pins of the DRAM. The test output pads O1-OM are used to couple to data pins of the DRAM.

The function block module 110 has a plurality of function output pins and a plurality of function input pins. The function output pins of the function block module 110 are coupled to the test input pads I1-IN. Moreover, the function input pins of the function block module 110 and the input pins of the logical gates in the test interfacing module 120 are coupled to the selector 130. The selector 130 is coupled to the test output pads O1-OM. The selector 130 are used for connecting the test output pads O1-OM to the function input pins of the function block module 110 or the input pins of the logical gates in the test interfacing module 120 according to a mode selecting signal SS. Beside, the selector 130 is also coupled to the mode selecting circuit 140, and the selector 130 receives the mode selecting signal SS provided by the mode selecting circuit 140.

In detail, when a boundary scan test is performed on the DRAM, the mode selecting circuit 140 provides the mode selecting signal SS which is enabled (for example, the mode selecting signal SS is kept on a logical level high), and the selector 130 connects the test output pads O1-OM to the output pins of the logical gates in the test interfacing module 120 according to the mode selecting signal SS. Pleas note here, one of the output pins of the logical gates in the test interfacing module 120 can be connected to one or more test output pads O1-OM. On the contrary, when the boundary scan test performed on the DRAM has done, the mode selecting circuit 140 provides the mode selecting signal SS which is disabled (for example, the mode selecting signal SS is kept on a logical level low), and the selector 130 connects the test output pads O1-OM to the function output pins in the function block module 110 according to the mode selecting signal SS.

In this embodiment, each of the logical gates has two or more input pins. Each of the logical gates receives two or more signals from test input pads for a logical operation, and each of the logical gates generates a logical output according to the logical operation. It can be realized easily, two or more signals from test input pads I1-IN can be interpreted by one signal on an output pin of one of the logical gates. That is, the number of the signal lines can be reduced by the boundary scan test interface circuit 100 when the boundary scan test operation is performed on the DRAM.

Figure 2:
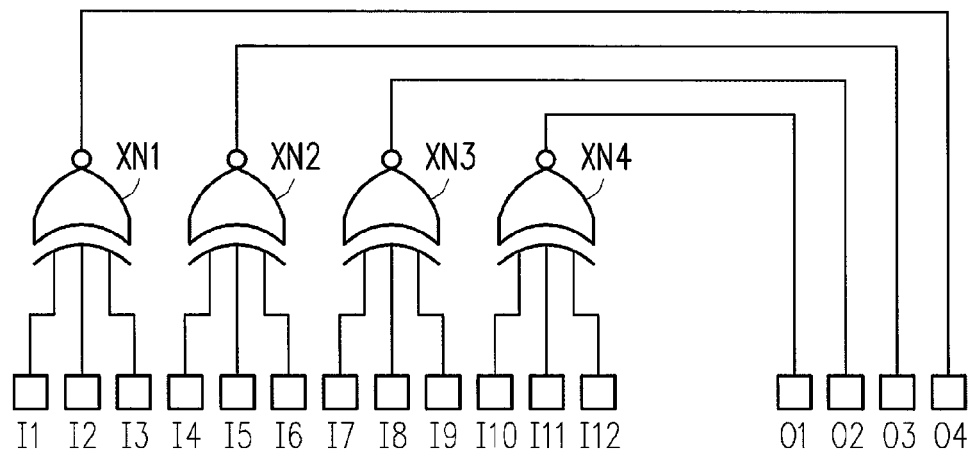
FIGS. 2-7 are a plurality of circuit diagrams of the test interfacing module 120 according to an embodiment of the present invention.

Referring to FIG. 2, FIG. 2 is a circuit diagram of the test interfacing module 120 according to an embodiment of the present invention. In FIG. 2, the test interfacing module 120 includes a plurality of XNOR gates XN1-XN4. Each of the XNOR gates XN1-XN4 has three input pins. The input pins of XNOR gates XN1 are coupled to the test input pads I1-I3, the input pins of XNOR gates XN2 are coupled to the test input pads I4-I6, the input pins of XNOR gates XN3 are coupled to the test input pads I7-I9, and the input pins of XNOR gates XN4 are coupled to the test input pads I10-I12. The output pins of the XNOR gates XN1-XN4 are respectively coupled to the test output pads O1-O4. In this embodiment, the test input pads I1-I12 can be connected to a plurality of address pins A1-A12 and/or control pins of DRAM respectively, a the test output pads O1-O4 can be connected to the data pins DQ1-DQ4 of DRAM. Especially, one test output pad can be coupled to one or more data pins of DRAM. That is, take the test output pad O1 for example, a bit data equal to A1 xnor A2 xnor A3 is outputted to the data pins DQ1, wherein the xnor means an inverted exclusive or operation.

Please notice here, in this embodiment, the number of signal lines can be reduced form 12 to 4. That is, the horizontal routes between the DRAM and PCB can be reduced.

Figure 3:
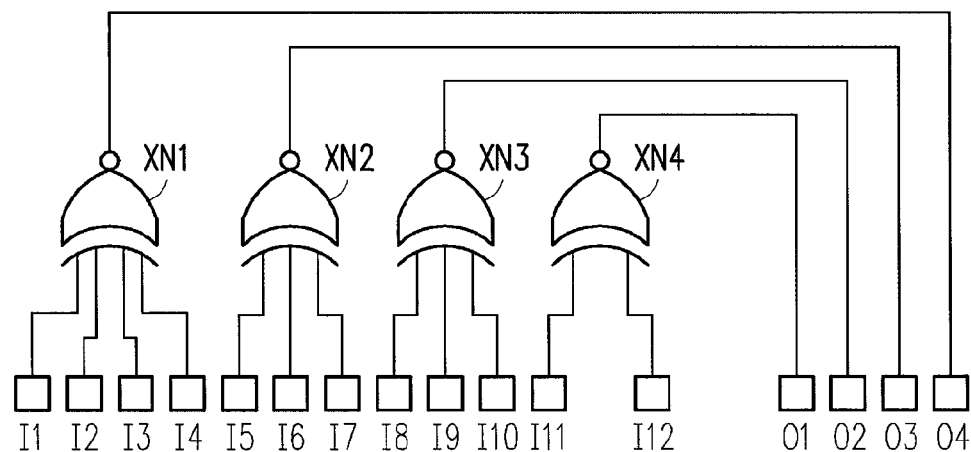

Referring to FIG. 3, FIG. 3 is a circuit diagram of the test interfacing module 120 according to another embodiment of the present invention. In FIG. 3, the number of the input pins of each of the XNOR gates can be different. Please notice here, the XNOR gate XN1 has four input pins for connecting to the test input pads I1-I4. The XNOR gate XN4 has only two input pins for connecting to the test input pads I11-I12.

Figure 4:
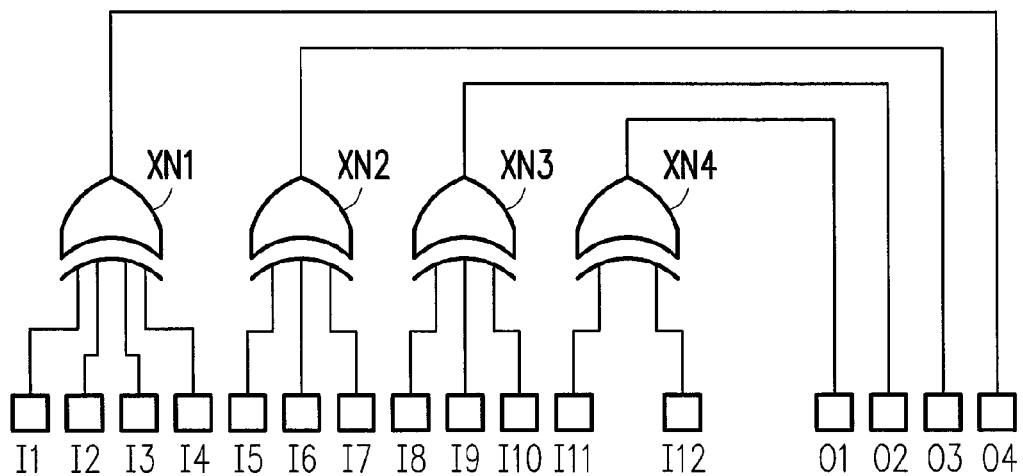

Referring to FIG. 4, FIG. 4 is a circuit diagram of the test interfacing module 120 according to another embodiment of the present invention. In FIG. 4, the test interfacing module 120 includes a plurality of XOR gates X1-X4. The XOR gate X1 has four input pins, the XOR gates X2-X3 have three input pins, and the XOR gate X4 has two input pins. The input pins of XOR gates X1-X4 are coupled to the test input pads I1-I12 in sequential. The output pins of the XOR gates X1-X4 are respectively coupled to the test output pads O1-O4. In this embodiment, the test input pads I1-I12 can be connected to a plurality of address pins A1-A12 of DRAM respectively, a the test output pads O1-O4 can be respectively connected to the data pins DQ1-DQ4 of DRAM. That is, take the test output pad O1 for example, a bit data equal to A1 xor A2 xor A3 xor A4 is outputted to the data pins DQ1, wherein the xor means an exclusive or operation.

Figure 5:
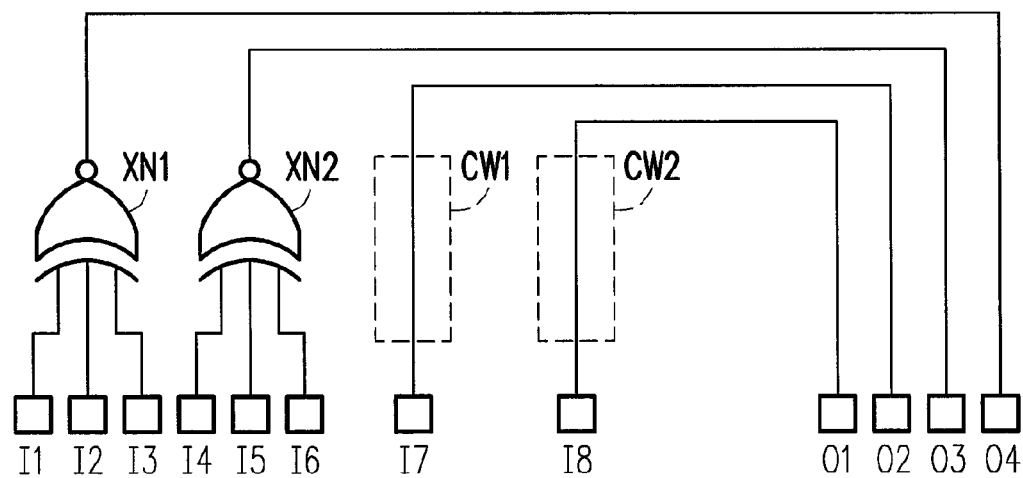

Referring to FIG. 5, FIG. 5 is a circuit diagram of the test interfacing module 120 according to another embodiment of the present invention. The test interfacing module 120 includes XNOR gates XN1 and XN2 and conducting wires CW1 and CW2. The input pins of the XNOR gates XN1 and XN2 are coupled to the test input pads I1-I6, respectively. The conducting wire CW1 is connected between the test input pad I7 and the test output pad O3, and the conducting wire CW2 is connected between the test input pad I8 and the test output pad O4. That is, the signal on the test input pad I7 and I8 can be directly transported to the test output pad O3 and O4 respectively.

Figure 6:
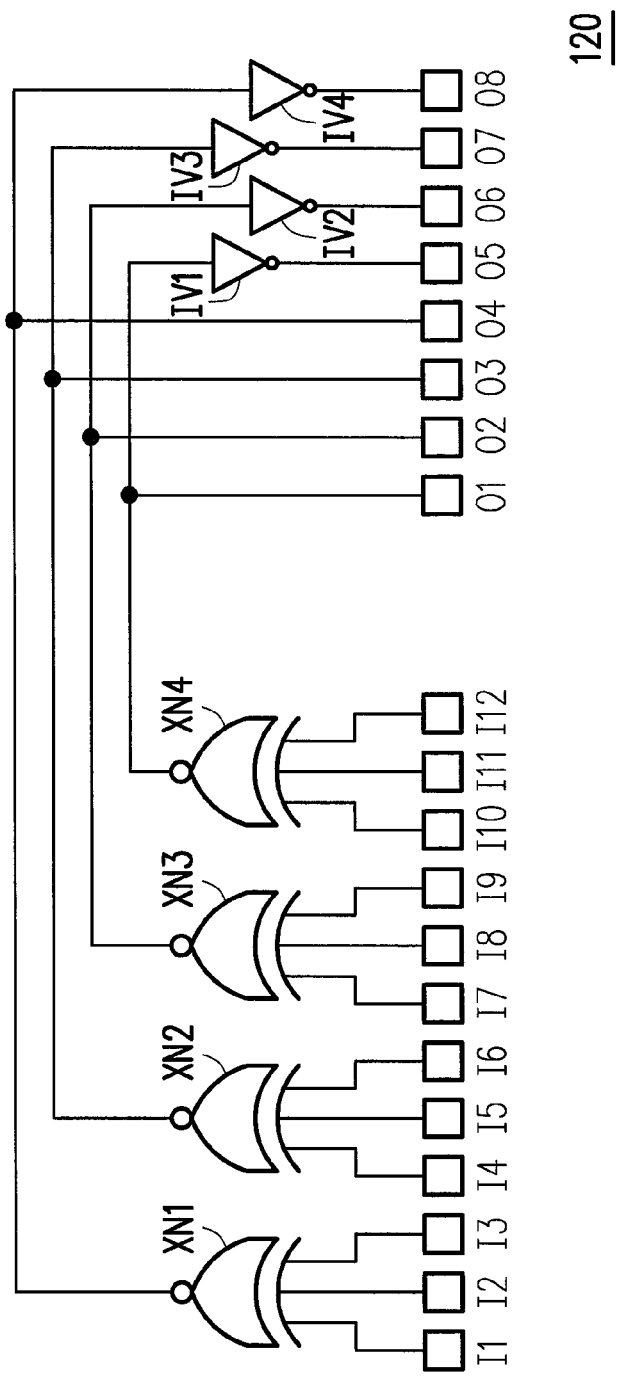

Referring to FIG. 6, FIG. 6 is a circuit diagram of the test interfacing module 120 according to another embodiment of the present invention. In FIG. 6, the test interfacing module 120 includes XNOR gates XN1-XN4. The input pins of the XNOR gates XN1-XN4 are coupled to the test input pads I1-I12 respectively. The output pins of the XNOR gates XN1-XN4 are coupled to a portion of the test output pads O1-O4. Besides, the output pins of the XNOR gates XN1-XN4 are also coupled to inverters IV1-IV4. The output pins of the inverters IV1-IV4 are coupled to another portion of the test output pads O5-O8.

Figure 7:
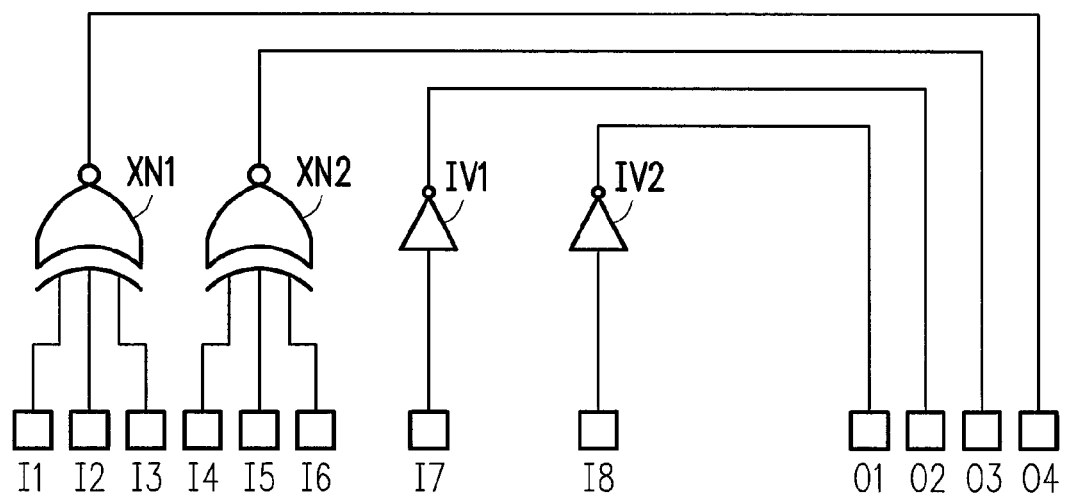

Referring to FIG. 7, FIG. 7 is a circuit diagram of the test interfacing module 120 according to another embodiment of the present invention. In FIG. 7, the test interfacing module 120 includes XNOR gates XN1 and XN2 and inverters IV1 and IV2. The input pins of the XNOR gates XN1 and XN2 are coupled to a portion of the test input pads I1-I6, and input pins of the inverters IV1 and IV2 are coupled to another portion of the test input pads I7 and I8. The output pins of the XNOR gates XN1 and XN2 are coupled to the test output pads O1 and O2, and the output pins of the inverters are coupled to the test output pads O3 and O4.

In summary, in the invention, during a boundary scan test is performed on a DRAM, the boundary scan test interface circuit receives a plurality of input signals from a plurality of test input pads, and the test input pads are coupled to address pins and/or control pins of the DRAM. Moreover, the boundary scan test interface circuit converts two or more of the input signals to an output signal by a logical gate, and transports the output signal to one of data pins of the DRAM through one of the test output pad. That is, the number of the signals transported from the input pins to the output pins is reduced.

Accordingly, the number of the horizontal routes between the DRAM and printed circuit board can be reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A boundary scan test interface circuit, applied for a dynamic random access memory (DRAM), comprising:
    N test input pads, wherein N is positive integer;
    a test interfacing module, coupled to the test input pads, the test interfacing module having a plurality of logical gates, and each of input pins of each of the logical gates coupled to each of the test input pads;
    M test output pads, coupled to output pins of the logical gates in the test interfacing module, wherein M is positive integer, and M is smaller than N;
    a function block module, having a plurality of function output pins and a plurality of function input pins;
    a selector, coupled between the function input pins, the test input pads and the input pins of the logical gates of the test interfacing module, the selector selecting each of the function input pins or each of the input pins of the logical gates to connect to each of the test input pads according to a mode selecting signal; and
    a mode selecting circuit, coupled to the selector, the mode selecting circuit providing the mode selecting signal to the selector,
    wherein the test interfacing module is configured to test opens or shorts on each of the test input and output pads.

2. The boundary scan test interface circuit according to claim 1, wherein each of the test input pads coupled to one of the address pins and control pins of the DRAM, each of the test output pads coupled to at least one data output pin of the DRAM.

3. The boundary scan test interface circuit according to claim 1, wherein the logical gates comprise:
    a plurality of XOR gates, each of the XOR gates has at least two input pins, each of the input pins of the XOR gates coupled to each of the test input pads, and each of output pins of the XOR gates coupled to each of the test output pads.

4. The boundary scan test interface circuit according to claim 1, wherein the logical gates comprise:
    a plurality of XNOR gates, each of the XNOR gates has at least two input pins, each of the input pins of the XNOR gates coupled to each of the test input pads, and each of output pins of the XNOR gates coupled to each of the test output pads.

5. The boundary scan test interface circuit according to claim 1, wherein the logical gates comprise:
    a plurality of XOR gates, each of the XOR gates has at least two input pins, each of the input pins of the XOR gates coupled to each of a first portion of the test input pads, and each of output pins of the first portion of the XOR gates coupled to each of a first portion of the test output pads; and
    a plurality of inverters, each of the input pins of the inverters coupled to each of a second portion of the test input pads, and the output pins of each of the second portion of the inverters coupled to a second portion of the test output pads.

6. The boundary scan test interface circuit according to claim 1, wherein the logical gates comprise:
    a plurality of XNOR gates, each of the XNOR gates has at least two input pins, each of the input pins of the XNOR gates coupled to each of the test input pads, and each of the output pins of each of the XNOR gates coupled to each of a first portion of the test output pads; and
    a plurality of inverters, each of the input pins of the inverters coupled to each of the output pins of the XNOR gates, and each of output pins of the inverters coupled to each of a second portion of the test output pads.

7. The boundary scan test interface circuit according to claim 1, the test interfacing module further comprises:
    at least one conducting wire, coupled between one of the test input pads and one of the test output pads.

* * * * *